(12) United States Patent
Kwon et al.

(10) Patent No.: US 7,442,273 B2
(45) Date of Patent: Oct. 28, 2008

(54) APPARATUS USING HYBRID COUPLED PLASMA

(75) Inventors: Gi-Chung Kwon, Gyeonggi-do (KR); Hong-Young Chang, Daejeon (KR); Yong-Kwan Lee, Daejeon (KR)

(73) Assignee: Jusung Engineering Co., Ltd., Kwangju-shi (KR)

( * ) Notice: Subject to any disclaimer, the term of this patent is extended or adjusted under 35 U.S.C. 154(b) by 472 days.

(21) Appl. No.: 10/892,259

(22) Filed: Jul. 14, 2004

(65) Prior Publication Data

US 2005/0017201 A1 Jan. 27, 2005

(30) Foreign Application Priority Data

Jul. 14, 2003 (KR) .................. 10-2003-0047847

(51) Int. Cl.
*C23C 16/00* (2006.01)
*C23F 1/00* (2006.01)
*H01L 21/306* (2006.01)

(52) U.S. Cl. .............. 156/345.48; 156/345.43; 156/345.44; 156/345.47; 118/723 E; 118/723 I (58) Field of Classification Search ........... 118/723 I, 118/723 E, 723 R; 156/345.48, 345.43, 156.44, 156/156.45, 345.47
See application file for complete search history.

(56) References Cited

U.S. PATENT DOCUMENTS

| | | | |
|---|---|---|---|
| 5,647,913 A | | 7/1997 | Blalock |
| 5,916,820 A | * | 6/1999 | Okumura et al. ............ 438/694 |
| 6,020,686 A | * | 2/2000 | Ye et al. ................ 315/111.51 |
| 6,033,481 A | * | 3/2000 | Yokogawa et al. ..... 156/345.41 |
| 6,280,563 B1 | | 8/2001 | Baldwin, Jr. et al. |
| 6,310,577 B1 | * | 10/2001 | Ra .............................. 343/701 |
| 6,388,382 B1 | * | 5/2002 | Doi et al. ............... 315/111.51 |
| 6,414,648 B1 | * | 7/2002 | Holland et al. .............. 343/895 |
| 6,632,322 B1 | * | 10/2003 | Gottscho et al. ....... 156/345.33 |
| 6,756,737 B2 | * | 6/2004 | Doi et al. ............... 315/111.51 |
| 2002/0023899 A1 | * | 2/2002 | Khater et al. .......... 219/121.41 |

FOREIGN PATENT DOCUMENTS

WO  WO03/029513  4/2003

* cited by examiner

*Primary Examiner*—Parviz Hassanzadeh
*Assistant Examiner*—Rakesh K Dhingra
(74) *Attorney, Agent, or Firm*—Marger Johnson & McCollom PC (57) ABSTRACT

A hybrid coupled plasma type apparatus includes: a chamber having a gas-injecting unit; an electrostatic chuck in the chamber; an insulating plate over the gas-injecting unit; a high frequency generator; an impedance matching circuit connected to the high frequency generator; first and second antennas connected to the impedance matching circuit in parallel, a power of the high frequency generator being supplied to the first and second antennas; an electrode of a plate shape connected to one of the first and second antennas in serial, the power of the high frequency generator being supplied to the electrode; and a power distributor between the high frequency generator and one of the first and second antennas.

14 Claims, 7 Drawing Sheets

APPARATUS USING HYBRID COUPLED PLASMA

This application claims the benefit of Korean Patent Application No. 2003-0047847, filed on Jul. 14, 2003, which is hereby incorporated by reference.

BACKGROUND OF THE INVENTION

1. Field of the Invention

This invention relates to an apparatus for fabrication of a semiconductor device, more particularly, it relates to an apparatus using hybrid coupled plasma (HCP) having properties of inductively coupled plasma (ICP) and capacitively coupled plasma (CCP).

2. Discussion of the Related Art

As industry relating to semiconductor devices is developed, a fabricating apparatus of semiconductor devices having high capacity and high function has been researched. Accordingly, integration of much more number of elements in a limited area has been required. In addition, technology of ultra fine patterning and high integration has been researched and developed in fabrication field of semiconductor devices.

In order to obtain semiconductor devices having ultra fine patterning and high integration, a technology using plasma obtained by activating reaction gases has been widely used in a fabricating process of semiconductor devices. In the fabricating process of semiconductor devices, positive ions or radical of reaction gases in plasma state are used for depositing or etching a layer in a predetermined area of a substrate. A fabricating apparatus of semiconductor devices includes a chamber where plasma is formed. The chamber of the apparatus may be classified into a capacitively coupled plasma (CCP) type and an inductively coupled plasma (ICP) type according to a method of forming plasma.

Figure 1:
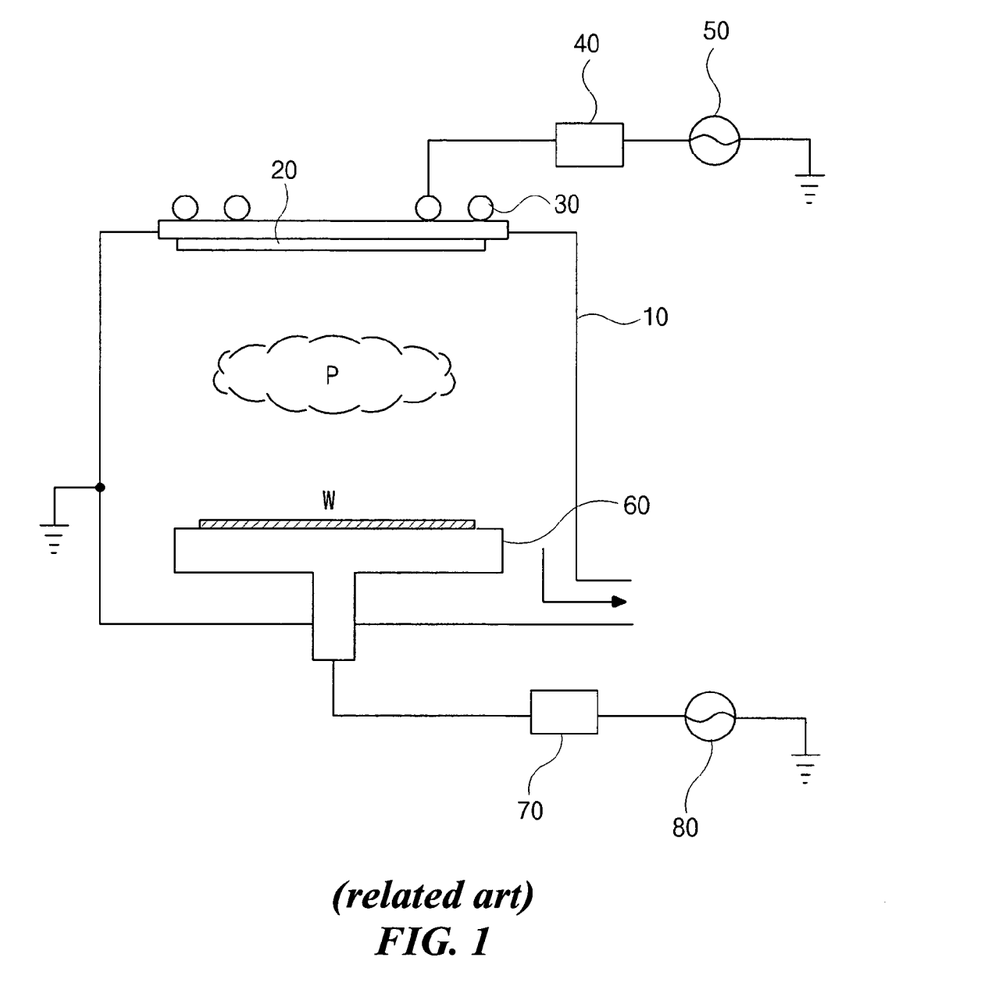
FIG. 1 is a schematic view of an ICP type fabricating apparatus of a semiconductor device according to the related art.

FIG. 1 is a schematic view of an ICP type fabricating apparatus of a semiconductor device according to the related art. In FIG. 1, the ICP type fabricating apparatus includes a chamber 10 having an exhaust hole, a gas-injecting unit 20, an antenna 30 and an electrostatic chuck 60. Reaction gases are sprayed into the chamber 10 through the gas-injecting unit 20 and a source power is supplied to the antenna 30. A substrate "W" is loaded on the electrostatic chuck 60 where a bias power is supplied. In addition, a source radio frequency (RF) generator 50 and a source impedance matching box 40 are connected to the chamber 10. The source RF generator 50 supplies the source power to the antenna 30 and the source impedance matching box 40 matches a load impedance to a characteristic impedance of connection cables connected to the source RF generator 50. Moreover, a bias RF generator 80 and a bias impedance matching box 70 are connected to the electrostatic chuck 60. The bias RF generator 80 supplies the bias power to the electrostatic chuck 60 and the bias impedance matching box 70 matches a load impedance to a characteristic impedance of connection cables connected to the bias RF generator 80.

After the substrate "W" is disposed on the electrostatic chuck 60, the substrate "W" is fixed on the electrostatic chuck 60 by an electrostatic force. Then, the reaction gases are injected into the chamber 10. At the same time, the source power is supplied to the antenna 30 and the bias power is supplied to the electrostatic chuck 60. The reaction gases are activated by the source power and the bias power to form plasma "P." Positive ions in the plasma "P" rush onto and collide with the substrate "W" to form or etch a layer.

An ICP type fabricating apparatus of a semiconductor device has high production yield and low probability of damaging a substrate because of high plasma density and low ion energy distribution. The plasma density, however, is uniform in a central portion of the chamber and is not uniform in a boundary portion of the chamber. As the substrate is enlarged, the uniformity difference in the central portion and the boundary portion may further deteriorate the reliability of fabrication process.

Figure 2:
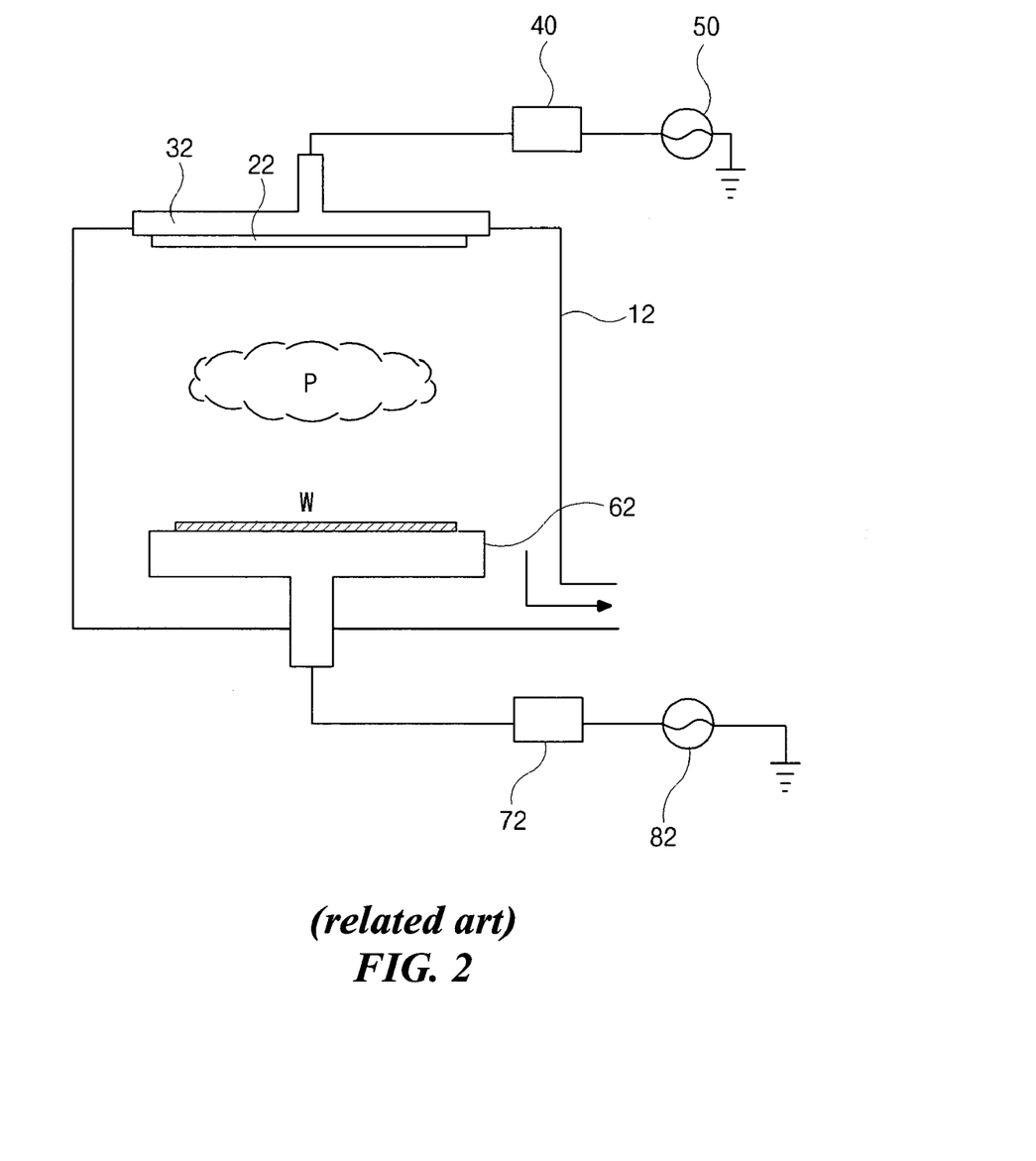
FIG. 2 is a schematic view of a CCP type fabricating apparatus of a semiconductor device according to the related art.

FIG. 2 is a schematic view of a CCP type fabricating apparatus of a semiconductor device according to the related art. In FIG. 2, the CCP type fabricating apparatus includes a chamber 12 having an exhaust hole, a gas-injecting unit 22, an upper electrode 32 of a plate shape and an electrostatic chuck 62 as a lower electrode. Reaction gases are sprayed into the chamber 12 through the gas-injecting unit 22 and a source power is supplied to the upper electrode 32. A substrate "W" is loaded on the electrostatic chuck 62 where a bias power is supplied. In addition, a source RF generator 52 and a source impedance matching box 42 are connected to the chamber 12. The source RF generator 52 supplies the source power to the upper electrode 32 and the source impedance matching box 42 matches a load impedance to a characteristic impedance of connection cables connected to the source RF generator 52. Moreover, a bias RF generator 82 and a bias impedance matching box 72 are connected to the electrostatic chuck 62. The bias RF generator 82 supplies the bias power to the electrostatic chuck 62 and the bias impedance matching box 72 matches a load impedance to a characteristic impedance of connection cables connected to the bias RF generator 82.

After the substrate "W" is disposed on the electrostatic chuck 62, the chamber 12 is evacuated and the reaction gases are injected into the chamber 12. Then, an electric field is generated between the upper electrode 32 and the electrostatic chuck 62 by applying the source RF power and the bias RF power to the upper electrode 32 and the electrostatic chuck 62, respectively.

In a CCP type fabricating apparatus of a semiconductor device, ions produced by the high intensity electric field are used for an etching process because the ions have high energy. However, the ions can not be used for a chemical vapor deposition (CVD) process and a sputtering process under a low pressure because of their high energy. Specifically, since plasma produced in a CCP type apparatus has high sheath voltage, high self bias and high plasma impedance, the plasma may further deteriorate a substrate.

SUMMARY OF THE INVENTION

Accordingly, the present invention is directed to a hybrid coupled plasma type apparatus that substantially obviates one or more of the problems due to limitations and disadvantages of the related art.

To overcome the problems described above, the present invention provides a hybrid coupled plasma (HCP) type apparatus having advantages of an ICP type apparatus and a CCP type apparatus.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other objects and in accordance with the purpose of the present invention, as embodied and broadly described, a hybrid coupled plasma type apparatus includes: a chamber having a gas-injecting unit; an electrostatic chuck in the chamber; an insulating plate over the gas-injecting unit;

a high frequency generator; an impedance matching circuit connected to the high frequency generator; first and second antennas connected to the impedance matching circuit in parallel, a power of the high frequency generator being supplied to the first and second antennas; an electrode of a plate shape connected to one of the first and second antennas in serial, the power of the high frequency generator being supplied to the electrode; and a power distributor between the high frequency generator and one of the first and second antennas.

In another aspect, a hybrid coupled plasma type apparatus includes: a chamber; a chuck in the chamber; a gas-injecting unit over the electrostatic chuck; an insulating plate on the gas-injecting unit; an antenna on the insulating plate; an electrode on the antenna; a source impedance matching circuit connected to the antenna and the electrode; a source generator connected to the source impedance matching circuit; a power distributor between the source impedance matching circuit and the antenna; a bias impedance matching circuit connected to the chuck; and a bias generator connected to the bias impedance matching circuit.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to embodiments of the present invention, which are illustrated in the accompanying drawings. Wherever possible, the same reference numbers will be used throughout the drawings to refer to the same or like parts.

Figure 3:
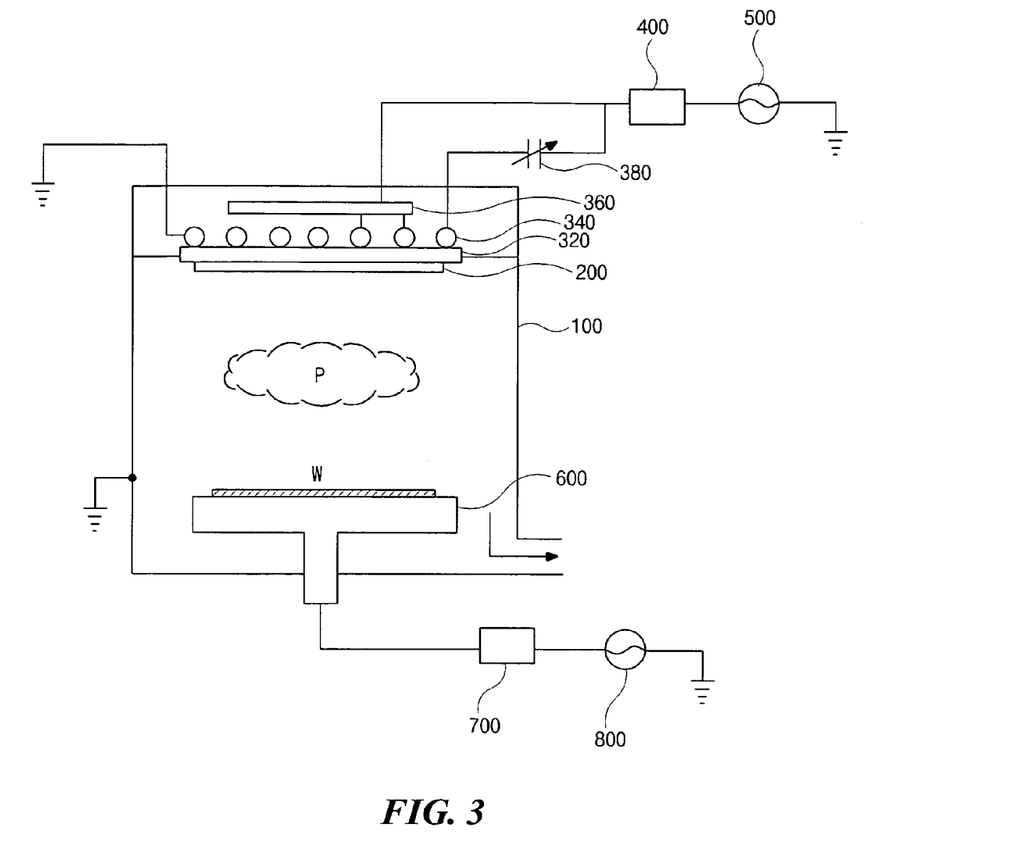
FIG. 3 is a schematic view of a hybrid coupled plasma (HCP) type apparatus according to an embodiment of the present invention.

FIG. 3 is a schematic view of a hybrid coupled plasma (HCP) type apparatus according to an embodiment of the present invention.

In FIG. 3, the HCP apparatus includes a chamber 100 having an exhaust hole, an electrostatic chuck 600, a gas-injecting unit 200, an insulating plate 320, an antenna 340 and an electrode 360 of a plate shape. The electrostatic chuck 600 may be disposed at a bottom portion of the chamber 100 and a substrate "W" is loaded on the electrostatic chuck 600. The gas-injecting unit 200 may be disposed at a top portion of the chamber 100 and the insulating plate 320 is disposed on the gas-injecting unit 200. In addition, a source radio frequency (RF) generator 500 and a source impedance matching box (I.M.B.) 400 are connected to the antenna 340 and the electrode 360, and a bias RF generator 800 and a bias impedance matching box 700 are connected to the electrostatic chuck 600. Reaction gases are sprayed into the chamber 100 through the gas-injecting unit 200. The insulating plate 320 is used for producing plasma of an optimum state. Since a transmission of an RF electric field depends on a dielectric constant of a dielectric material, a transmission of power to the reaction gases may be controlled by the insulating plate 320. For example, the insulating plate 320 may be formed of ceramic.

A source RF power is supplied to the antenna 340 and the electrode 360, and a bias power is supplied to the electrostatic chuck 600. The antenna 340 may be connected to the source impedance matching box 400 through a variable capacitor 380.

Figure 4A:
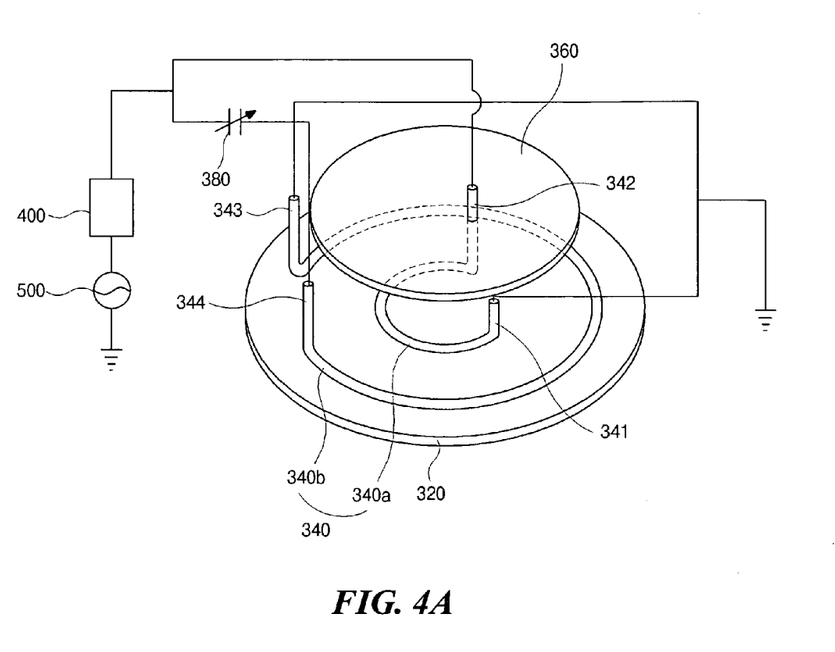
FIG. 4A is a schematic view showing an antenna for an HCP type apparatus according to an embodiment of the present invention.
Figure 4B:
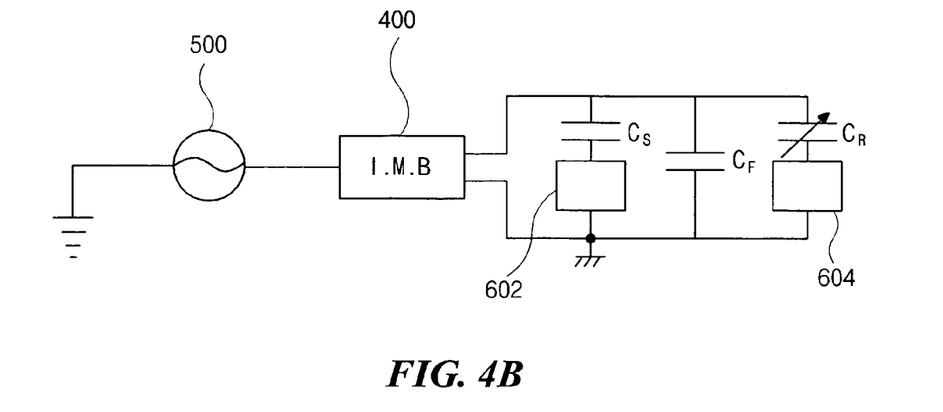
FIG. 4B is an equivalent circuit diagram of FIG. 4A.

FIG. 4A is a schematic view showing an antenna for an HCP type apparatus according to an embodiment of the present invention and FIG. 4B is an equivalent circuit diagram of FIG. 4A.

In FIGS. 4A and 4B, an antenna 340 includes first and second sub-antennas 340a and 340b connected to a source matching box 400 in parallel. The first and second sub-antennas 340a and 340b are disposed over the insulating plate 320 and may constitute concentric rings where the second sub-antenna 340b surrounds the first sub-antenna 340a. The first sub-antenna 340a includes first and second ends 341 and 342, and the second sub-antenna 340b includes first and second ends 343 and 344. The first end 341 of the first sub-antenna 340a is grounded and the second end 342 of the first sub-antenna 340a is connected to the source impedance matching box 400 through a hole of the electrode 360 over the antenna 340. Since the first sub-antenna 340a contacts the electrode 360 at the hole of the electrode 360, the first sub-antenna 340a is electrically connected to the electrode 360. In addition, the first end 343 of the second sub-antenna 340b is grounded and the second end 344 of the second sub-antenna 340b is connected to the variable capacitor ($C_R$) 380. The variable capacitor ($C_R$) 380 functions as a power distributor distributing the source RF power of the source RF generator 500 to the first and second sub-antennas 340a and 340b and the electrode 360.

The first and second sub-antennas 340a and 340b may be formed of a tube having a hollow therein and a surface of the first and second sub-antennas 340a and 340b may be coated with silver. In addition, the first and second sub-antennas 340a and 340b may be disposed on a single plane. The electrode 360 corresponds to an upper electrode of a CCP type apparatus and the shape of the electrode 360 may be varied according to arrangement of the insulating plate 320 and the antenna 340. The electrode 360 may be parallel to the plane constituted by the first and second sub-antennas 340a and 340b.

The variable capacitor ($C_R$) 380 controls a current flowing through the antenna 340 to select one of an ICP type, a CCP type and a HCP type for forming plasma from reaction gases in the chamber 100. The HCP type has both properties of the ICP type and the CCP type. The parallel resonance inductively coupled type plasma impedance corresponding to an ICP component and the capacitively coupled type plasma impedance corresponding to a CCP component may be varied in the absolute value and the phase by the variable capacitor ($C_R$) 380. Accordingly, currents and voltages of the ICP component and the CCP component may be controlled by the variable capacitor ($C_R$) 380.

The resistance, the capacitance and the inductance of the first sub-antenna 340a may be represented by a first impedance 602 and the resistance, the capacitance and the inductance of the second sub-antenna 340b may be represented by a second impedance 604. The capacitance between the electrode 360 and the electrostatic chuck 600 may be represented by a first capacitor "$C_F$" and the stray capacitance between the electrode 360 and the antenna 340 may be represented by a second capacitor "$C_S$."

Figure 5A:
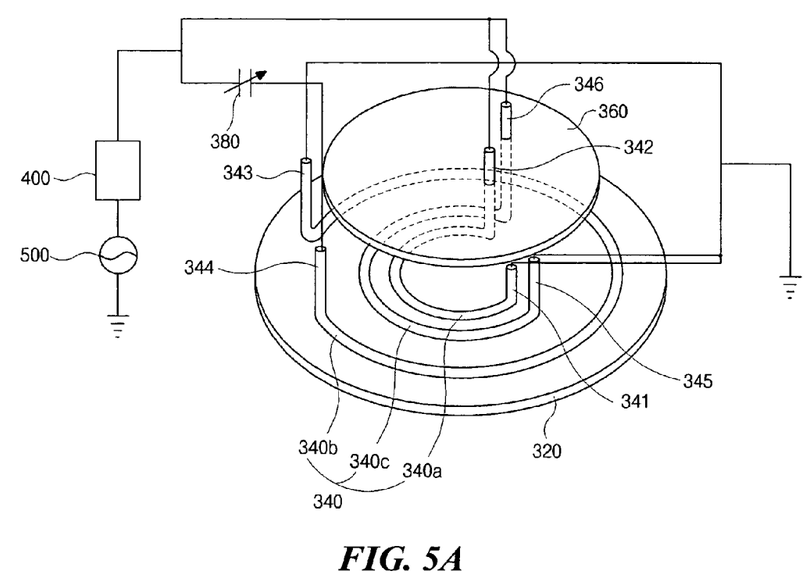
FIG. 5A is a schematic view showing an antenna for an HCP type apparatus according to another embodiment of the present invention.
Figure 5B:
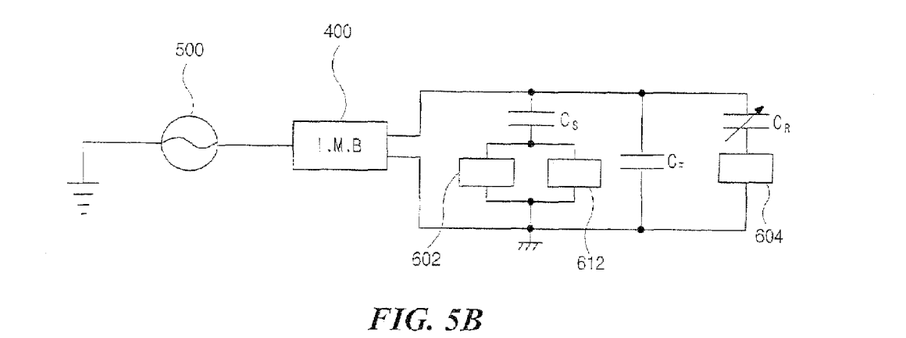
FIG. 5B is an equivalent circuit diagram of FIG. 5A.

FIG. 5A is a schematic view showing an antenna for an HCP type apparatus according to another embodiment of the present invention and FIG. 5B is an equivalent circuit diagram of FIG. 5A.

In FIGS. 5A and 5B, an antenna 340 includes first, second and third sub-antennas 340a, 340b and 340c connected to a source matching box 400 in parallel. The first, second and third sub-antennas 340a, 340b and 340c are disposed over the insulating plate 320 and may constitute concentric rings where the third sub-antenna 340c surrounds the first sub-antenna 340a and the second sub-antenna 340b surrounds the third sub-antenna 340c. Accordingly, the third sub-antenna 340c is disposed between the first and second sub-antennas 340a and 340b. Each of the first, second and third sub-antennas 340a, 340b and 340c includes first and second ends. The first ends 342 and 346 of the first and third sub-antennas 340a and 340c are connected to the source impedance matching box 400 through holes of the electrode 360, and the second ends 341 and 345 of the first and third sub-antennas 340a and 340c are grounded. Since the first and third sub-antennas 340a and 340c contact the electrode 360 at the holes of the electrode 360, the first and third sub-antennas 340a and 340c are electrically connected to the electrode 360. In addition, the first end 343 of the second sub-antenna 340b is grounded and the second end 344 of the second sub-antenna 340b is connected to the variable capacitor ($C_R$) 380. The variable capacitor ($C_R$) 380 functions as a power distributor distributing the source RF power of the source RF generator 500 to the first sub-antenna 340a, the second sub-antenna 340b, the third sub-antenna 340c and the electrode 360.

The first, second and third sub-antennas 340a, 340b and 340c may be formed of a tube having a hollow therein and silver may be coated on a surface of the first, second and third sub-antennas 340a, 340b and 340c. In addition, the first, second and third sub-antennas 340a, 340b and 340c may be disposed on a single plane. The electrode 360 corresponds to an upper electrode of a CCP type apparatus and the shape of the electrode 360 may be varied according to arrangement of the insulating plate 320 and the antenna 340. The electrode 360 may be parallel to the plane constituted by the first, second and third sub-antennas 340a, 340b and 340c.

The variable capacitor ($C_R$) 380 controls a current flowing through the antenna 340 to select one of an ICP type, a CCP type and a HCP type for forming plasma from reaction gases in the chamber 100. The HCP type has both properties of the ICP type and the CCP type. The parallel resonance inductively coupled type plasma impedance corresponding to an ICP component and the capacitively coupled type plasma impedance corresponding to a CCP component may be varied in the absolute value and the phase by the variable capacitor ($C_R$) 380. Accordingly, currents and voltages of the ICP component and the CCP component may be controlled by the variable capacitor ($C_R$) 380.

The resistance, the capacitance and the inductance of the first sub-antenna 340a may be represented by a first impedance 602 and the resistance, the capacitance and the inductance of the second sub-antenna 340b may be represented by a second impedance 604. Moreover, the resistance, the capacitance and the inductance of the third sub-antenna 340c may be represented by a third impedance 612. The capacitance between the electrode 360 and the electrostatic chuck 600 may be represented by a first capacitor "$C_F$" and the stray capacitance between the electrode 360 and the antenna 340 may be represented by a second capacitor "$C_S$."

Figure 6:
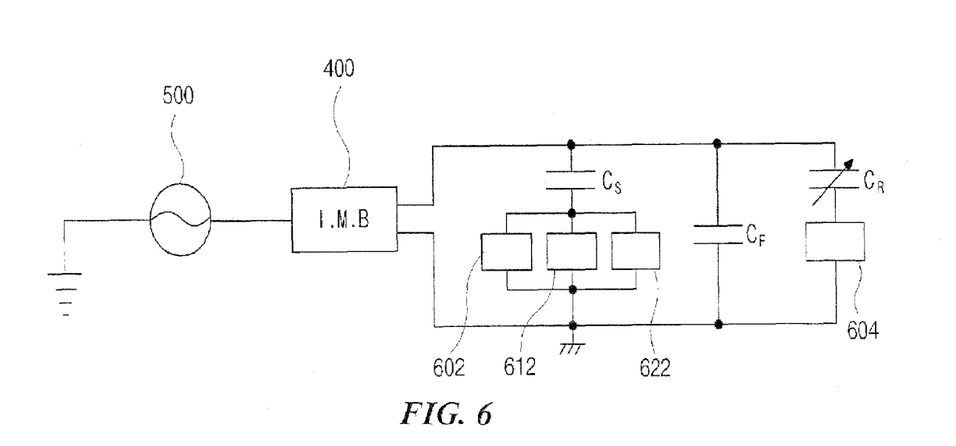
FIG. 6 is an equivalent circuit diagram of an antenna for an HCP type apparatus according to another embodiment of the present invention.

FIG. 6 is an equivalent circuit diagram of an antenna for an HCP type apparatus according to another embodiment of the present invention.

Even though not shown in FIG. 6, an antenna may include first, second, third and fourth sub-antennas connected to a source matching box 400 in parallel. The first, second, third and fourth sub-antennas may constitute concentric rings where the third and fourth sub-antennas are disposed between the first and second sub-antennas. Each of the first, second, third and fourth sub-antennas includes first and second ends. The first ends of the first, third and fourth sub-antennas may be connected to the source impedance matching box 400 through holes of the electrode, and the second ends of the first, third and fourth sub-antennas are grounded. Since the first, third and fourth sub-antennas contact the electrode at the holes of the electrode, the first, third and fourth sub-antennas are electrically connected to the electrode. In addition, the first end of the second sub-antenna may be grounded and the second end of the second sub-antenna may be connected to the variable capacitor "$C_R$." The variable capacitor "$C_R$" functions as a power distributor distributing the source RF power of the source RF generator 500 to the first sub-antenna, the second sub-antenna, the third sub-antenna, the fourth sub-antenna and the electrode.

Each sub-antenna may be formed of a tube having a hollow therein and silver may be coated on a surface of each sub-antenna. In addition, the first, second, third and fourth sub-antennas may be disposed on a single plane. The electrode corresponds to an upper electrode of a CCP type apparatus and the shape of the electrode may be varied according to arrangement of the insulating plate and the antenna. The electrode may be parallel to the plane constituted by the first, second, third and fourth sub-antennas.

The variable capacitor "$C_R$" controls a current flowing through the antenna to select one of an ICP type, a CCP type and a HCP type for forming plasma from reaction gases in the chamber. The HCP type has both properties of the ICP type and the CCP type. The parallel resonance inductively coupled type plasma impedance corresponding to an ICP component and the capacitively coupled type plasma impedance corresponding to a CCP component may be varied in the absolute value and the phase by the variable capacitor "$C_R$."

Accordingly, currents and voltages of the ICP component and the CCP component may be controlled by the variable capacitor "$C_R$."

The resistance, the capacitance and the inductance of the first sub-antenna may be represented by a first impedance 602 and the resistance, the capacitance and the inductance of the second sub-antenna may be represented by a second impedance 604. Moreover, the resistance, the capacitance and the inductance of the third sub-antenna may be represented by a third impedance 612 and the resistance, the capacitance and the inductance of the fourth sub-antenna may be represented by a fourth impedance 622. The capacitance between the electrode and the electrostatic chuck may be represented by a first capacitor "$C_F$" and the stray capacitance between the electrode and the antenna may be represented by a second capacitor "$C_S$."

Even though not shown in figures, a plurality of sub-antennas more than two may be disposed between the first and second sub-antennas and the variable capacitor may be connected to the other sub-antennas except the second sub-antenna.

Referring to FIGS. 3 to 6, operation of an HCP type apparatus according to the present invention will be illustrated hereinafter. After disposing a substrate "W" on an electrostatic chuck 600, the substrate is fixed on the electrostatic chuck 600 by an electrostatic force. Then, reaction gases are injected into a chamber 100 through a gas-injecting unit 200. At the same time, a source power is supplied to an antenna 340 and a bias power is supplied to the electrostatic chuck 600. The electrostatic chuck 600 and the antenna 340 function as a plasma-generating unit corresponding to a related art ICP type apparatus, and the electrode 360 and the electrostatic chuck 600 function as a plasma-generating unit corresponding to a related art CCP type apparatus. Accordingly, the reaction gases are activated by the source power and the bias power to form plasma "P" in the chamber 100. The plasma "P" may have a strong oxidizing force. Positive ions in the plasma "P" rush onto and collide with the substrate "W" to form or etch a layer.

An HCP type apparatus according to the present invention may be used as one of an ICP type, a CCP type and an HCP type having both properties of the ICP type and the CCP type by controlling a variable capacitor connected to an antenna on the basis of the kind and the size of a substrate and/or the kind of reaction gases. For example, the plasma may approach an ICP type plasma when the variable capacitor has a high capacitance, and the plasma may approach a CCP type plasma when the variable capacitor has a low capacitance. Consequently, an HCP type apparatus according to the present invention may be operated in one of an ICP type, a CCP type and an HCP type by a variable capacitor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A hybrid coupled plasma type apparatus, comprising:
   a chamber having a gas-injecting unit;
   an electrostatic chuck in the chamber;
   an insulating plate over the gas-injecting unit;
   a high frequency generator;
   an impedance matching circuit connected to the high frequency generator;
   first and second antennas that are concentric ring shaped and connected to the impedance matching circuit in parallel, a power of the high frequency generator being supplied to the first and second antennas;
   an electrode of a plate shape disposed above the first and second antennas and connected to one of the first and second antennas in serial, the power of the high frequency generator being supplied to the electrode; and
   a variable capacitor as a power distributor connected between the impedance matching circuit and one of the first and second antennas and controlling a current between the high frequency generator and one of the first and second antennas and between the high frequency generator and the electrode, wherein the variable capacitor controls the current to select one of an ICP type and a CCP type for forming a plasma from reaction gases in the chamber.

2. The apparatus according to claim 1, wherein a substrate is loaded on the electrostatic chuck.

3. The apparatus according to claim 1, wherein the high frequency generator is a radio frequency generator.

4. The apparatus according to claim 1, wherein the electrode is parallel to a plane defined by the first and second antennas.

5. The apparatus according to claim 1, wherein the variable capacitor has a first capacitance for an inductively coupled plasma and a second capacitance for a capacitively coupled plasma, and the first capacitance is higher than the second capacitance.

6. The apparatus of claim 1, farther comprising:
   a bias impedance matching circuit connected to the chuck; and
   a bias generator connected to the bias impedance matching circuit.

7. The apparatus according to claim 1, wherein the second antenna surrounds the first antenna.

8. The apparatus according to claim 7, wherein the electrode has a hole and a first end of the first antenna is connected to the source impedance matching circuit through the hole such that the first antenna is electrically connected to the electrode.

9. The apparatus according to claim 8, wherein a first end of the second antenna is connected to the power distributor.

10. The apparatus according to claim 9, wherein second ends of the first and second antennas are grounded.

11. The apparatus according to claim 8, wherein the electrode extends horizontally over the antenna.

12. The apparatus according to claim 1, further comprising at least one third antenna between the first and second antennas.

13. The apparatus according to claim 12, wherein the at least one third antenna, the first antenna and the second antenna are connected to the impedance matching circuit in parallel.

14. A hybrid coupled plasma type apparatus, comprising:
   a chamber;
   an electrostatic chuck in the chamber;
   a gas-injecting unit over the electrostatic chuck;
   an insulating plate on the gas-injecting unit;
   an antenna disposed on the insulating plate;
   an electrode disposed on the antenna;
   a source impedance matching circuit connected to the antenna and the electrode;
   a source generator connected to the source impedance matching circuit;
   a bias impedance matching circuit connected to the electrostatic chuck; and
   a bias generator connected to the bias impedance matching circuit,
   wherein the antenna includes first and second sub-antennas connected to the source impedance matching circuit in parallel,
   wherein the electrode has a plate shape and is connected to one of the first and second sub-antennas in serial and is also connected to the source impedance matching circuit,
   wherein the first and second sub-antennas have a shape of concentric rings, wherein the electrode is parallel to a plane constituted by the first and second sub-antennas, wherein the second sub-antenna surrounds the first sub-antenna, and wherein the electrode has a hole and a first end of the first sub-antenna is connected to the source impedance matching circuit through the hole such that the first sub-antenna is electrically connected to the electrode, a variable capacitor as a power distributor connected between the impedance matching circuit and one of the first and second sub-antennas and controlling a current between the high frequency generator and one of the first and second sub-antennas and between the high frequency generator and the electrode, wherein the variable capacitor controls the current to select one of an ICP type and a CCP type for forming a plasma from reaction gases in the chamber.

* * * * *